United States Patent
Konno

(10) Patent No.: US 11,852,649 B2
(45) Date of Patent: Dec. 26, 2023

(54) ANCHOR STRUCTURE FOR REDUCING TEMPERATURE-BASED ERROR

(71) Applicant: MURATA MANUFACTURING CO., LTD., Nagaokakyo (JP)

(72) Inventor: Akira Konno, Helsinki (FI)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

(21) Appl. No.: 17/665,780

(22) Filed: Feb. 7, 2022

(65) Prior Publication Data

US 2022/0268799 A1 Aug. 25, 2022

(30) Foreign Application Priority Data

Feb. 22, 2021 (FI) ...................................... 20215191

(51) Int. Cl.
 *G01P 1/00* (2006.01)
 *G01P 15/125* (2006.01)
 *B81B 3/00* (2006.01)

(52) U.S. Cl.
 CPC ............ *G01P 1/006* (2013.01); *B81B 3/0081* (2013.01); *G01P 15/125* (2013.01); *B81B 2201/0235* (2013.01); *B81B 2203/0307* (2013.01); *B81B 2203/0392* (2013.01); *B81B 2203/056* (2013.01)

(58) Field of Classification Search
 CPC ....................................................... G01P 1/006
 USPC ......................................................... 73/497
 See application file for complete search history.

(56) References Cited

U.S. PATENT DOCUMENTS

| 2010/0175473 | A1 | 7/2010 | Classen |
| 2013/0255382 | A1 | 10/2013 | Tanaka |
| 2015/0000403 | A1* | 1/2015 | Liukku ................. G01P 15/18 |
| | | | 73/510 |
| 2015/0301075 | A1* | 10/2015 | Yamanaka ......... G01P 15/0802 |
| | | | 73/514.32 |
| 2015/0355222 | A1* | 12/2015 | Zhang .................. B81B 3/0094 |
| | | | 73/514.32 |
| 2016/0041194 | A1 | 2/2016 | Rytkönen et al. |
| 2016/0169931 | A1 | 6/2016 | Tocchio |
| 2020/0408803 | A1 | 12/2020 | Konno et al. |

FOREIGN PATENT DOCUMENTS

| JP | 2021004875 A | 1/2021 |
| WO | 2014061099 A1 | 4/2014 |

OTHER PUBLICATIONS

Finnish Search Report dated Sep. 16, 2021 corresponding to Finnish Patent Application No. 20215191.
Search Report dated Jun. 21, 2022, corresponding to European Patent Application No. 22154463.
Notice of Reasons for Refusal dated Feb. 14, 2023, corresponding to Japanese Patent Application No. 2022-022157.

* cited by examiner

*Primary Examiner* — Walter L Lindsay, Jr.
*Assistant Examiner* — Philip T Fadul
(74) *Attorney, Agent, or Firm* — SQUIRE PATTON BOGGS (US) LLP

(57) ABSTRACT

The present invention relates to microelectromechanical systems (MEMS), and more specifically to an anchor structure for anchoring MEMS components within a MEMS device. The anchor points for rotor and stator components of the device are arranged such that the anchor points are arranged along and overlap a common axis.

10 Claims, 3 Drawing Sheets

ANCHOR STRUCTURE FOR REDUCING TEMPERATURE-BASED ERROR

TECHNICAL FIELD

The present invention relates to microelectromechanical systems (MEMS), and more specifically to an anchor structure for anchoring MEMS components within a MEMS device.

BACKGROUND

In MEMS devices, the movement of components within the MEMS device may be measured in order to measure external quantities, such as acceleration or rotation. In a MEMS accelerometer, for example, a proof mass, which is relatively free to move in along at least one axis, moves under external acceleration relative to fixed components of the accelerometer. Movement of the proof mass is measured capacitively, with one or more moveable electrodes located on the proof mass and one or more fixed electrodes located on a fixed structure within the accelerometer. The fixed and moveable electrodes form one or more capacitors, the capacitance of which changes as the proof mass moves relative to the fixed structure.

In order to accurately measure the acceleration, movement of the fixed structure due to the external acceleration must be minimised, thus the fixed structure is anchored to the MEMS device, e.g. to a substrate of the device, at one or more anchor points. However, as the MEMS device experiences temperature changes, the relative positions of the fixed and moveable electrodes may change due to expansion or contraction within the device itself. It is therefore desirable to minimise the error introduced into the measurements of MEMS accelerometers, and other devices, caused by changes in temperature.

SUMMARY

According to a first aspect of the invention, a MEMS device is provided, the MEMS device comprises a substrate, which defines a substrate plane, a rotor mounted to the substrate via a rotor anchor point, wherein the rotor is capable of rotation with respect to the substrate plane, and two stators, wherein the position of each stator is fixed with respect to the substrate plane and mounted to the substrate via a stator anchor point. The rotor anchor point and stator anchor points are arranged such that all of the anchor points overlap a common axis.

The width of the rotor anchor point and stator anchor points may be the same, and the rotor anchor point and stator anchor points may be aligned along the common axis.

The rotor anchor point and stator anchor points may be rectangular.

The stator anchor points may be L-shaped and the L-shaped stator anchor points may be arranged such that the L-shapes of the stator anchor points are the same size and one of one of the stator anchor points is rotated by 180 degrees relative to the other stator anchor points and a first portion of each L-shape is parallel to the common axis and a second portion of each L-shape is perpendicular to the common axis; and the second portions of the L-shaped stator anchor points are aligned along the common axis.

The first portions of the L-shaped stator anchor points may overlap a second axis, the second axis being perpendicular to the common axis.

The width of the rotor anchor point measured perpendicular to the common axis may be the same as the width of the L-shaped stator anchor points.

The rotor anchor point may be rectangular in shape.

The length of the rotor anchor point and stator anchor points may be less than the width of the individual rotor anchor point and stator anchor points.

The device may be an accelerometer, and acceleration may be measured by capacitively measuring movement of the rotor relative to the stators.

The distance between adjacent anchor points in the direction parallel to the common axis may be less than twice the length of any of the anchor points in the direction parallel to the common axis.

DETAILED DESCRIPTION

Figure 1:
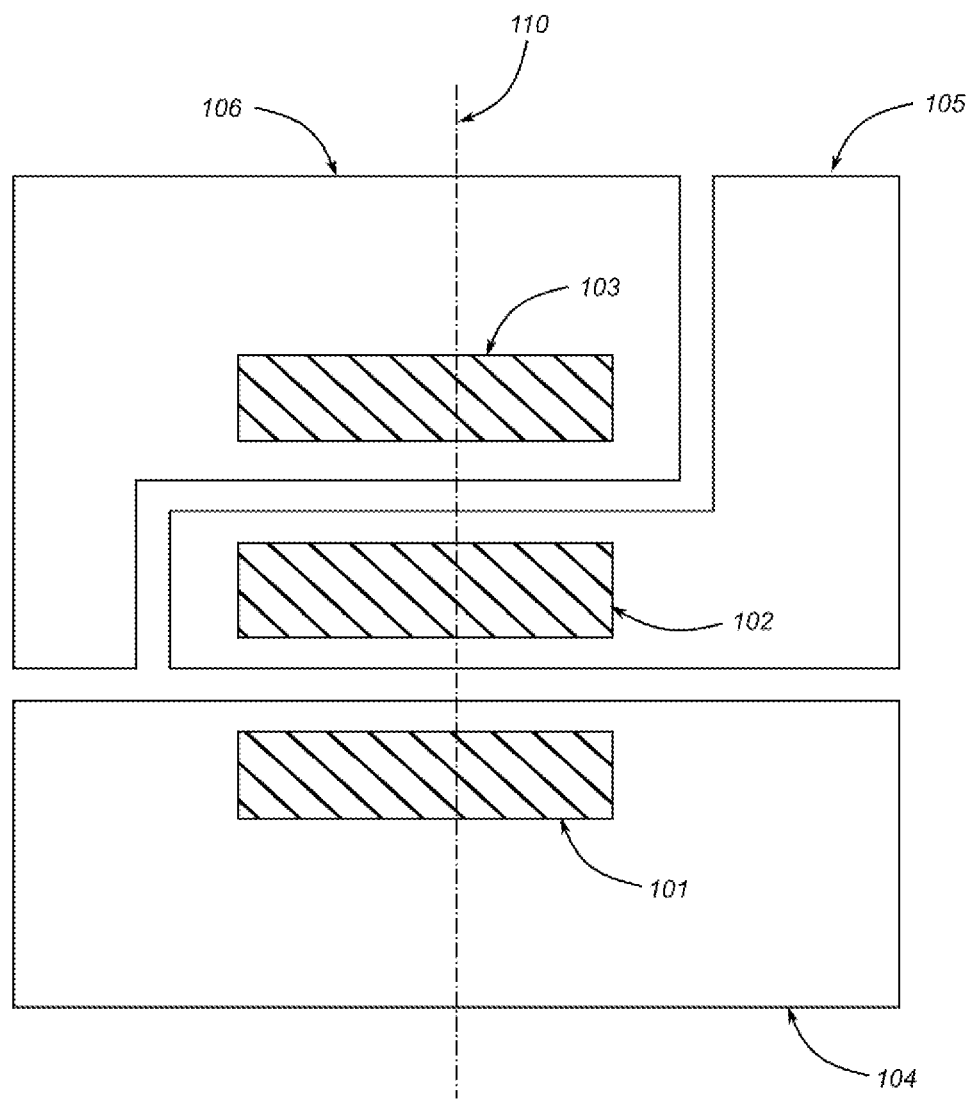
FIG. 1 shows an anchor arrangement according to a first embodiment of the invention.

FIG. 1 shows an anchor arrangement of a MEMS device according to a first embodiment of the invention. Three anchor points 101, 102 and 103 fix the micromechanical components of the MEMS device to the substrate on which the MEMS device is formed.

The MEMS device may be an accelerometer, in which case the anchor point 101 may be referred to as a rotor anchor point 101 and anchor points 102 and 103 as stator anchor points 102, 103. As shown in more detail with respect to FIG. 3, the rotor anchor point 101 anchors a rotor structure 104, e.g. a rotor suspender to which a rotor attached and permitted some degree of movement, to the substrate. The stator anchor points 102, 103 anchor stators 105, 106, which remain in a fixed position relative to the substrate, to the substrate. It will be appreciated that only parts of the rotor structure 104 and stators 105, 106 are shown in FIG. 1. In operation, acceleration of the MEMS device is detected by measuring the movement of the rotor relative to the stators using capacitive measurements.

As shown in FIG. 1, the anchor points 101-103 are arranged such that all of the anchor points overlap a common axis 110. In other words, the anchor points 101-103 are arranged in a line. This stands in contrast to convention anchor point arrangements where the stator anchor points 102, 103 are typically "side-by-side", rather than one "above" the other. The advantage of this arrangement is that as the MEMS device undergoes temperature changes and the anchor points 101-103 inevitably move due to expansion/contraction of the substrate and stress induced by the temperature change, the movement of all of the anchor points 101-103 is generally in the same direction. In contrast, when the stator anchor points 102, 103 are arranged side-by-side, they tend to move apart in the horizontal direction (i.e. perpendicular to axis 110) as well as moving in the vertical direction (i.e. parallel to axis 110). The arrangement of the anchor points shown in FIG. 1 therefore reduces the movement of the anchor points 101-103 relative to one another, and therefore also reduces the movement of the components that are connected to the anchor points 101-103 relative to one another. Since, in a MEMS accelerometer, the acceleration is measured based on the changing distance between electrodes located on the stator and the rotor, reducing movement caused by sources other than the external acceleration improves the accuracy of the acceleration measurement.

In this embodiment, the anchor points 101-103 are preferably aligned along the common axis 110. In this context, "aligned" means that the centre points of anchor points 101 to 103 are all in the same position relative to the common axis 110 measured in the axis perpendicular to the axis 110. This arrangement minimises the relative movement of the anchor points 101-103 as expansion/contraction or other deformation of the substrate along perpendicular to the common axis 110 affects all of the anchor points roughly equally.

The anchor points 101-103 may also all have the same width, as measured perpendicularly to the axis 110. This arrangement further reduces relative movement of the anchor points 101-103.

Preferably, the length of each anchor point 101-103, i.e. the distance between the outermost edges of the anchor points as measured parallel to the common axis 110, is less than the width of the anchor point 101-103, as measured perpendicularly to the common axis 110. In this way, the width of each individual anchor point 101-103 is sufficiently stable after the anchor points have been etched.

Figure 2:
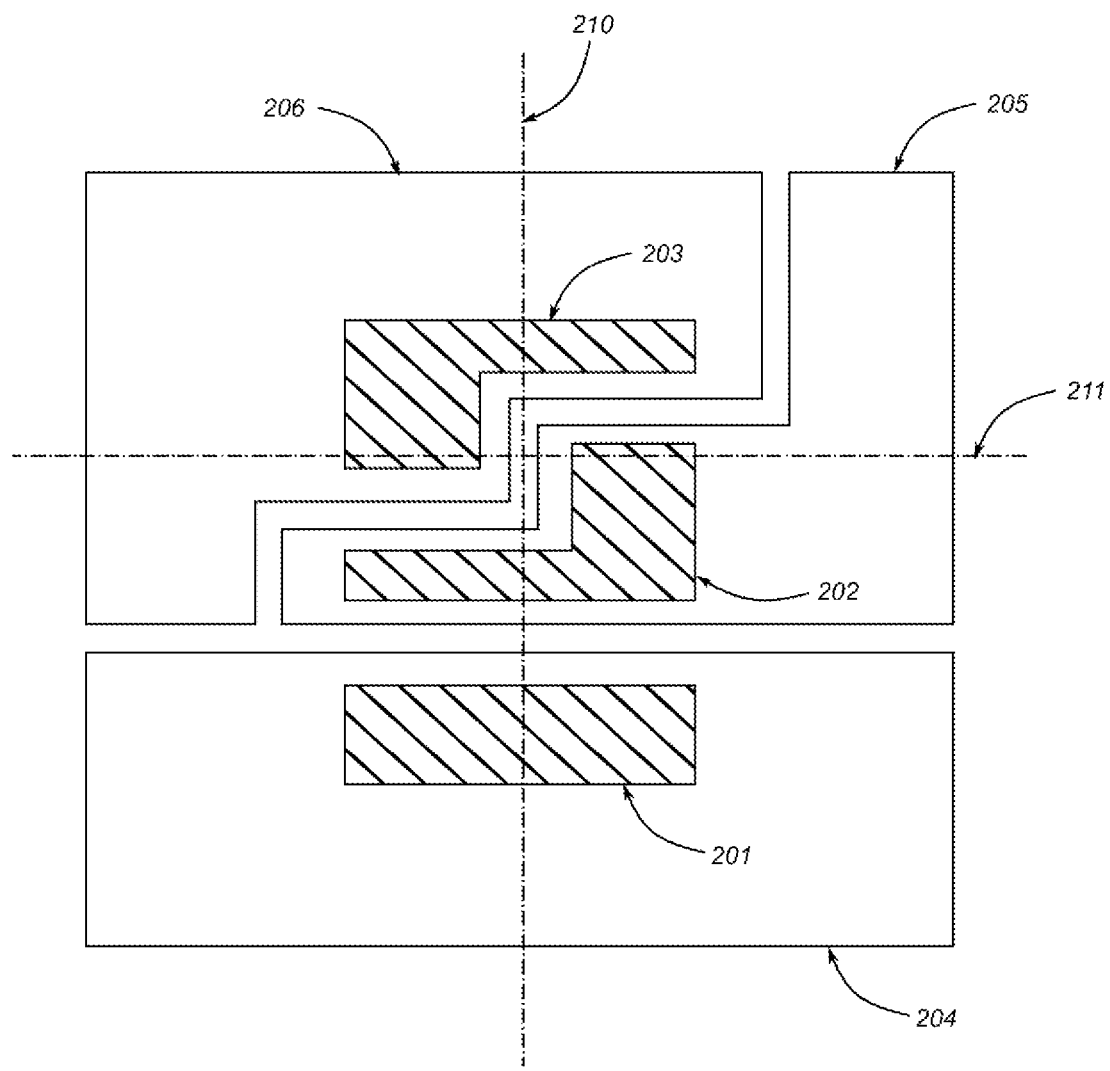
FIG. 2 shows an anchor arrangement according to a second embodiment of the invention.

A second embodiment of the invention is shown in FIG. 2. Anchor points 201-203 are again arranged such that they all overlap the common axis 210; however, in contrast to the stator anchor points 102-103 of FIG. 1, stator anchor points 202-203 are L-shaped. One of the stator anchor points 202-203 is arranged such that it is a 180-degree rotation of the other stator anchor point. Again, all three anchor points 201-203 are preferably aligned along the common axis 210.

The L-shape of the stator anchor points 202, 203 allows for greater maximum length and width of each anchor point, thereby providing increased stiffness in each direction, while also reducing the space on the substrate taken up by the anchor points 202-304. Indeed, the stator anchor points 202-203 may also overlap a second axis 211, which is perpendicular to the common axis 210, to minimise the space on the substrate that is occupied by the stator anchor points 202-203.

The rotor anchor point 201 may have the same width as the maximum width of stator anchor points 202, 203, but as shown in FIG. 2, may be generally rectangular in shape.

Figure 3:
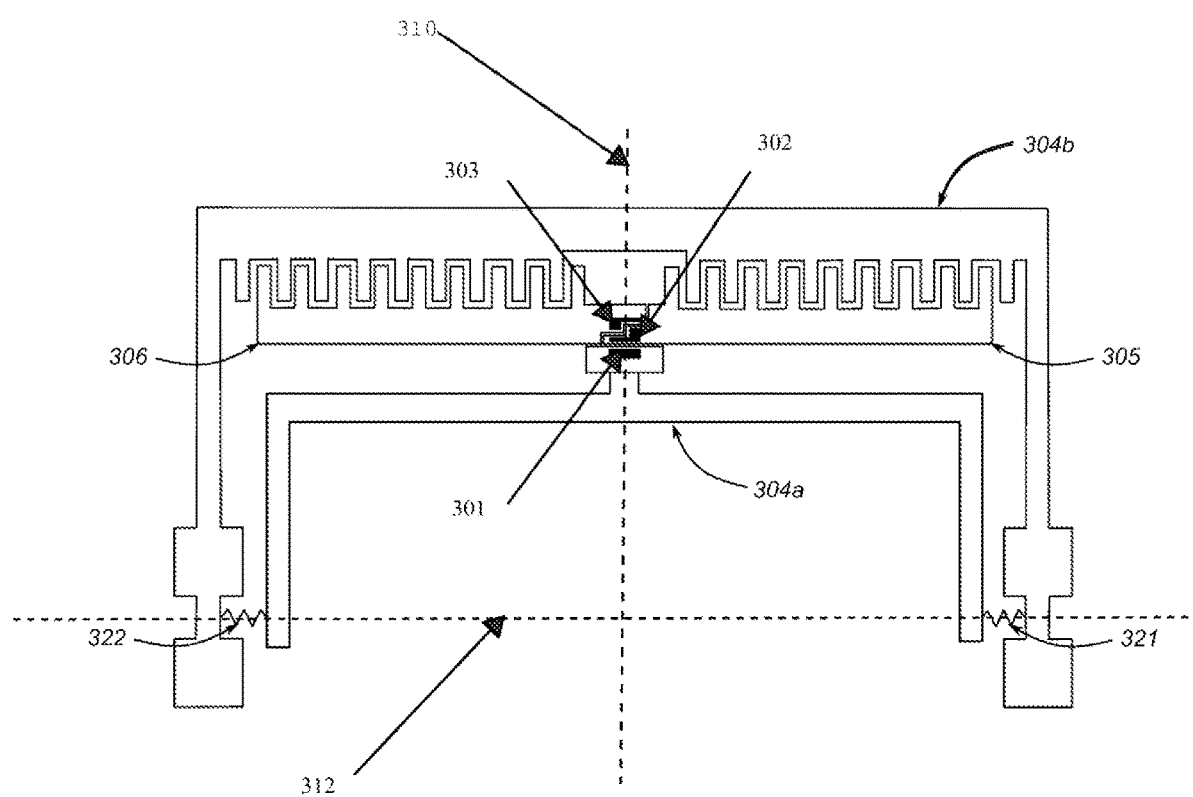
FIG. 3 shows the anchor arrangement of the second embodiment in use in a MEMS accelerometer.

FIG. 3 shows an exemplary MEMS accelerometer in which the anchor structure of FIG. 2 is used. It will be readily understood from FIG. 3 how the anchor structure of FIG. 1 could be used instead. FIG. 3 shows the rotor structure 304a, 304b, which comprises a rotor suspender 304a and the rotor 304b itself. The rotor suspender 304a is a stationary element that is anchored to the substrate through a rotor anchor point 301. The rotor 304b is a movable element that is connected to the rotor suspender 304a by springs 321, 322, which allow the rotor to rotate out of the plane of the page and relative to the substrate and stators 305, 306, which are fixed to the substrate through stator anchor points 302, 303. Specifically, the rotor is configured to rotate about a rotation axis 312 that is parallel to the substrate and perpendicular to the common axis 310. The rotor 304b and the stators 305, 306 each include capacitor electrodes, such as comb electrodes, such that movement of the rotor 304b towards or away from the stators 305, 306 causes a change in capacitance between the electrodes. The extent of the change in capacitance is in proportion to the extent of the movement of the rotor 304b, and the extent of the movement of the rotor 304b is in proportion to the extent of the force (and therefore acceleration) applied to the accelerometer in a direction perpendicular to the plane of the page. Thus, by measuring the capacitance, the acceleration of the MEMS device can be determined. As shown in FIG. 3, the stators 305, 306 are electrically separate and symmetric with respect to the common axis 310 so that they can be used to differentially measure capacitances caused by motions of the rotor 304b. Arranging the stator and rotor anchor points to overlap the common axis 310 reduces the movement of the stator anchor points relative to one another, and therefore specifically improves accuracy of the differential detection through them.

The invention claimed is:

1. A MEMS device comprising:
   a substrate, which defines a substrate plane;
   a rotor mounted to the substrate via a rotor anchor point, wherein the rotor is capable of rotation about a rotation axis with respect to the substrate plane; and
   two stators, wherein the position of each stator is fixed with respect to the substrate plane and mounted to the substrate via a stator anchor point; wherein
   a first stator is mounted to the substrate via a first stator anchor point and a second stator is mounted to the substrate via a second stator anchor point;
   the first stator and the second stator are electrically separate, and capacitor electrodes on the first stator are symmetric with capacitor electrodes on the second stator with respect to a common axis that is perpendicular to the rotation axis so that they can be used to differentially measure capacitances caused by motions of the rotor;
   the rotor anchor point, the first stator anchor point and the second stator anchor point overlap the common axis.

2. The MEMS device of claim 1, wherein the width of the rotor anchor point, the first anchor point and the second stator anchor point is the same, and wherein the rotor anchor point, the first anchor point and the second stator anchor point are aligned along the common axis.

3. The MEMS device of claim 1, wherein the rotor anchor point, the first anchor point and the second stator anchor points are rectangular.

4. The MEMS device of claim 1, wherein the first and second stator anchor points are L-shaped and wherein the first and second L-shaped stator anchor points are arranged such that:
   the L-shapes of the first and second stator anchor points are the same size and the second stator anchor point is rotated by 180 degrees relative to the first stator anchor point;
   first portion of each L-shape is parallel to the common axis and a second portion of each L-shape is perpendicular to the common axis; and
   the second portions of the L-shaped stator anchor points are aligned along the common axis.

5. The MEMS device of claim 4, wherein the width of the rotor anchor point measured perpendicular to the common axis is the same as the width of the L-shaped stator anchor points.

6. The MEMS device of claim 5, wherein the rotor anchor point is rectangular in shape.

7. The MEMS device of claim 1, wherein the length of the rotor anchor point and the first and second stator anchor points is less than the width of the individual rotor anchor point and stator anchor points.

8. The MEMS device of claim 1, wherein the device is an accelerometer, and wherein acceleration is measured by capacitively measuring movement of the rotor relative to the stators.

9. The MEMS device of claim 1, wherein the distance between adjacent anchor points in the direction parallel to the common axis is less than twice the length of any of the anchor points in the direction parallel to the common axis.

10. A MEMS device comprising:
- a substrate, which defines a substrate plane;
- a rotor mounted to the substrate via a rotor anchor point, wherein the rotor is capable of rotation with respect to the substrate plane; and
- two stators, wherein the position of each stator is fixed with respect to the substrate plane and mounted to the substrate via a stator anchor point;

wherein the rotor anchor point and stator anchor points are arranged such that all of the anchor points overlap a common axis, wherein the stator anchor points are L-shaped and wherein the L-shaped stator anchor points are arranged such that:

the L-shapes of the stator anchor points are the same size and one of one of the stator anchor points is rotated by 180 degrees relative to the other stator anchor points;

first portion of each L-shape is parallel to the common axis and a second portion of each L-shape is perpendicular to the common axis; and the second portions of the L-shaped stator anchor points are aligned along the common axis, wherein the first portions of the L-shaped stator anchor points overlap a second axis, the second axis being perpendicular to the common axis.

* * * * *